United States Patent
Lao et al.

(10) Patent No.: US 9,525,020 B2
(45) Date of Patent: Dec. 20, 2016

(54) SEMICONDUCTOR DEVICE AND METHOD FOR FORMING THE SAME

(71) Applicant: Vanguard International Semiconductor Corporation, Hsinchu (TW)

(72) Inventors: Chung-Ren Lao, Taichung (TW); Hsing-Chao Liu, Jhudong Township (TW); Tzung-Hsian Wu, Kaohsiung (TW); Chih-Jen Huang, Dongshan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/249,945

(22) Filed: Apr. 10, 2014

(65) Prior Publication Data

US 2015/0295018 A1    Oct. 15, 2015

(51) Int. Cl.
| | |
|---|---|
| H01L 27/108 | (2006.01) |
| H01L 49/02 | (2006.01) |
| H01L 27/06 | (2006.01) |
| H01L 21/28 | (2006.01) |
| H01L 29/49 | (2006.01) |
| H01L 29/66 | (2006.01) |

(52) U.S. Cl.
CPC ......... *H01L 28/60* (2013.01); *H01L 21/28052* (2013.01); *H01L 27/0629* (2013.01); *H01L 27/1085* (2013.01); *H01L 28/20* (2013.01); *H01L 29/4933* (2013.01); *H01L 29/665* (2013.01)

(58) Field of Classification Search
CPC ............................ H01L 27/1085; H01L 29/94
USPC ........................................ 257/516, 533, 538
See application file for complete search history.

(56) References Cited

U.S. PATENT DOCUMENTS

| | | | | |
|---|---|---|---|---|
| 5,130,267 A | * | 7/1992 | Kaya | H01L 21/28273 257/E21.008 |
| 6,246,084 B1 | * | 6/2001 | Kim | H01L 27/0629 257/296 |
| 6,762,109 B2 | * | 7/2004 | Murata | H01L 21/28518 257/306 |
| 7,535,079 B2 | * | 5/2009 | Remmel | H01L 23/5223 257/532 |
| 7,855,422 B2 | * | 12/2010 | Hu | H01L 27/0629 257/379 |
| 2003/0183880 A1 | * | 10/2003 | Goto | H01L 27/0629 257/379 |

FOREIGN PATENT DOCUMENTS

TW      200532928 A      10/2005

* cited by examiner

*Primary Examiner* — Chandra Chaudhari
(74) *Attorney, Agent, or Firm* — Birch, Stewart, Kolasch & Birch, LLP

(57) ABSTRACT

A semiconductor device including a substrate having an isolation structure therein is disclosed. A capacitor is disposed on the isolation structure and includes a polysilicon electrode, an insulating layer disposed on the polysilicon electrode, and a metal electrode disposed on the insulating layer. A method for forming the semiconductor device is also disclosed.

19 Claims, 3 Drawing Sheets

SEMICONDUCTOR DEVICE AND METHOD FOR FORMING THE SAME

BACKGROUND OF THE INVENTION

Field of the Invention

The present invention relates to a semiconductor device, and in particular to a semiconductor device having a metal-insulator-polysilicon (MIP) capacitor and a method for forming the same.

Description of the Related Art

In current semiconductor technologies, a polysilicon-insulator-polysilicon (PIP) capacitor and a polysilicon resistor are formed by performing several deposition processes and implantation processes.

However, the desired electrode materials, such as a polysilicon material, and processes, such as a doping process, to fabricate the PIP capacitor cost a lot. Moreover, the size of the semiconductor device is limited by the PIP stacked layers, and the PIP stacked layers also have a high thermal budget. As a result, an integrated density of the semiconductor device having the PIP stacked layers cannot be further improved. Therefore, development of the advanced process is limited.

Thus, there exists a need in the art for development of a semiconductor device and a method for forming the same capable of mitigating or eliminating the aforementioned problems.

BRIEF SUMMARY OF INVENTION

A detailed description is given in the following embodiments with reference to the accompanying drawings. A semiconductor device and method for forming the same are provided.

An exemplary embodiment of a semiconductor device according to the invention is provided. The semiconductor device comprises a substrate having an isolation structure therein. A capacitor is disposed on the isolation structure and comprises a polysilicon electrode, an insulating layer disposed on the polysilicon electrode, and a metal electrode disposed on the insulating layer.

An exemplary embodiment of a method for forming a semiconductor device according to the invention is provided. The method comprises providing a substrate having an isolation structure therein. A polysilicon electrode is formed on the isolation structure. An insulating layer is formed on the polysilicon electrode. A metal electrode is formed on the insulating layer, wherein a capacitor is composed of the polysilicon electrode, the insulating layer and the metal electrode.

A detailed description s given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1A to 1F are cross-sectional views of an exemplary embodiment of a method for forming a semiconductor device according to the invention.

DETAILED DESCRIPTION OF INVENTION

Figure 1A:
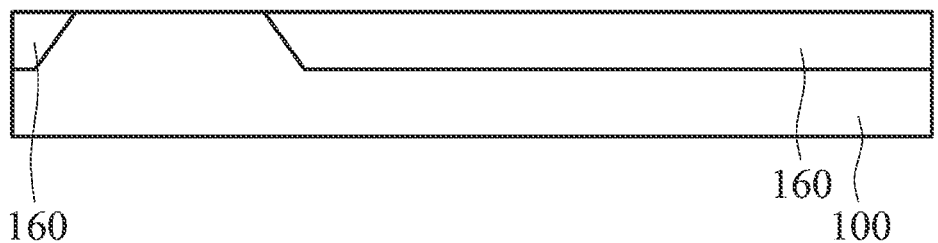

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 1B:
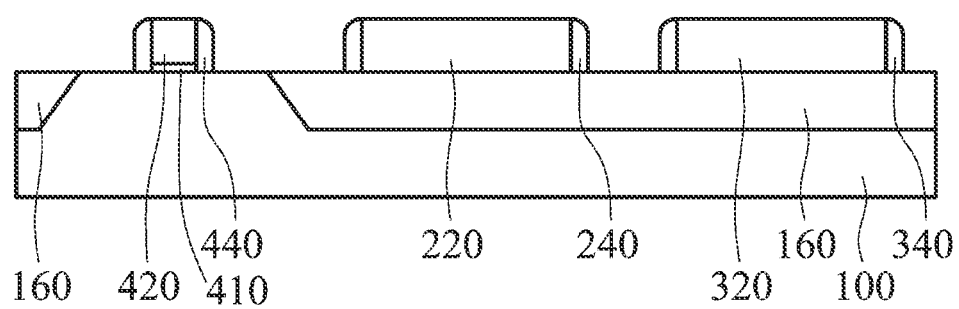
Figure 1C:
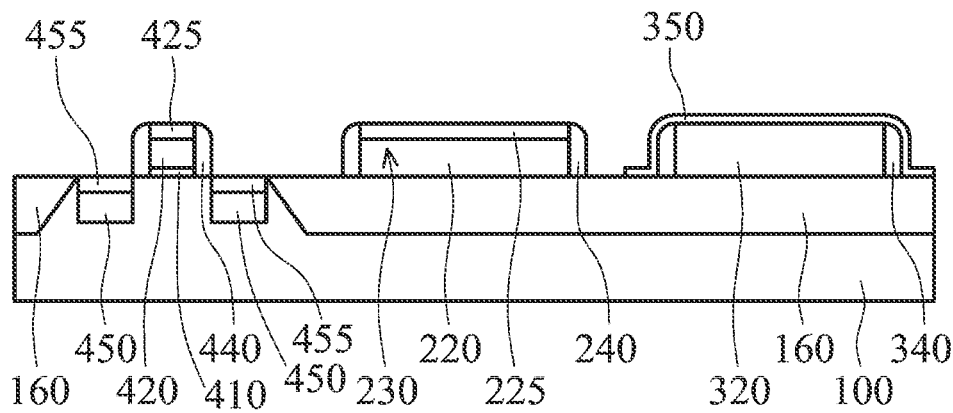
Figure 1D:
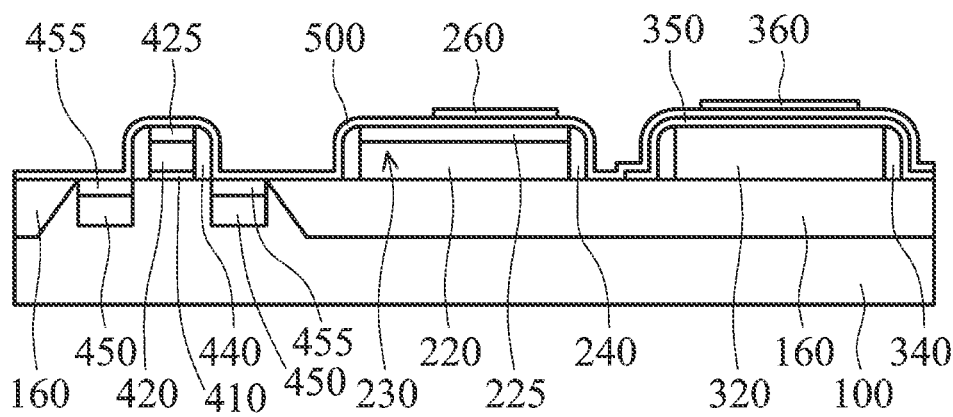
Figure 1E:
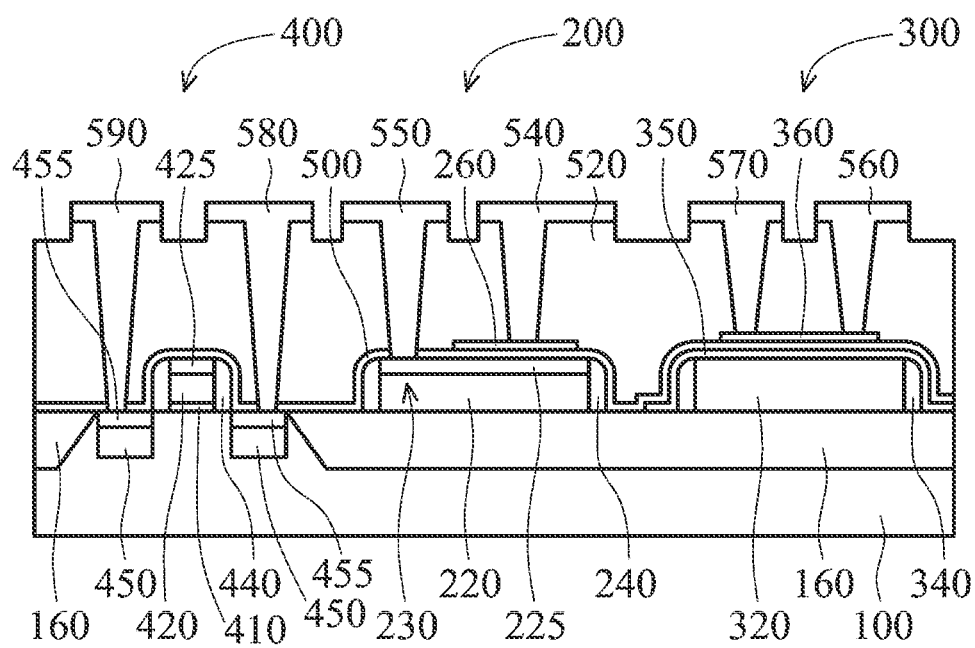

Referring to FIG. 1E, a cross-sectional view of an exemplary embodiment of a semiconductor device according to the invention is illustrated. In the embodiment, the semiconductor device comprises a substrate 100 and a capacitor 200. In one embodiment, the substrate 100 may be a single crystal silicon substrate, an epitaxial crystal silicon substrate, a silicon germanium substrate, a silicon-on-insulator (SOI) substrate, a compound semiconductor substrate or another suitable semiconductor substrate. In the embodiment, the substrate 100 has isolation structures 160 configured to define active regions therein. In one embodiment, the isolation structure 160 may be a shallow trench isolation (STI) structure. In another embodiment, the isolation structure 160 may be a local oxidation of silicon (LOCOS) structure.

The capacitor 200 is disposed on the isolation structure 160, and includes a polysilicon electrode 230, an insulating layer 500 covering the polysilicon electrode 230, and a metal electrode 260 disposed on the insulating layer 500. In the embodiment, the polysilicon electrode 230 is configured to be a bottom electrode of the capacitor 200. The insulating layer 500 is configured to be a capacitor dielectric layer of the capacitor 200. The metal electrode 260 is configured to be a top electrode of the capacitor 200.

In the embodiment, the polysilicon electrode 230 comprises a polysilicon layer 220 and a silicide/salicide layer 225 thereon. The silicide layer 225 is adjacent to a top surface of the polysilicon electrode 230. In one embodiment, the silicide layer 225 may comprise cobalt silicide, titanium silicide, tungsten silicide or other suitable materials. In one embodiment, the insulating layer 500 may comprise an oxynitride layer, an oxide layer, oxide-nitride-oxide stacked layers, high k dielectric material layers or other suitable insulating materials. In one embodiment, the metal electrode 260 may comprise titanium nitride, tantalum nitride, a copper aluminum alloy or other suitable conducting materials. Moreover, the metal electrode 260 may have a thickness in a range of 200 Å to 800 Å. In another embodiment, the metal electrode 260 may have a thickness in a range of 400 Å to 600 Å. In the embodiment, spacers 240 are disposed on sidewalls of the polysilicon electrode 230, and the insulating layer 500 covers the spacers 240.

In the embodiment, the semiconductor device further comprises a resistor 300 and a transistor 400. A polysilicon layer 320 is disposed on the isolation structures 160, and the polysilicon layers 220 and 320 are formed by the same material layer. A barrier layer 350 covers the polysilicon layer 320, and the insulating layer 500 configured to be the capacitor dielectric layer covers the barrier layer 350 and the polysilicon layer 320. A metal electrode 360 is disposed on the insulating layer 500 to serve as a resistor 300, and the metal electrodes 260 and 360 are formed by the same material layer. In the embodiment, spacers 340 are disposed on sidewalls of the polysilicon layer 320, and the insulating layer 500 configured to be the capacitor dielectric layer covers the spacers 340. In the embodiment, the spacers 240 and 340 are formed by the same material layer.

The transistor 400 is disposed on the substrate 100 in the active region defined by the isolation structures 160, and comprises a gate electrode and source/drain regions 450. The gate electrode comprises a gate dielectric layer 410, a polysilicon layer 420 on the gate dielectric layer 410, and a silicide layer 425 on the polysilicon layer 420. Spacers 440 are disposed on sidewalls of the gate electrode. In the embodiment, the spacers 240 and 440 are formed by the same material layer. The source/drain regions 450 are in the substrate 100 and respectively at two opposite sides of the gate electrode. The source/drain regions 450 comprise a silicide layer 455 adjacent to a top surface thereof, respectively. In the embodiment, the conductivity type of the source/drain regions 450 is n-type, but it is not limited thereto. In other embodiments, the conductivity type of the source/drain regions 450 is p-type and may be determined by design demands. For example, the source/drain regions 450 may comprise p-type dopants, such as boron or boron fluoride, or n-type dopants, such as phosphorous or arsenic. In the embodiment, the polysilicon layer 420 of the transistor 400 and the polysilicon layer 220 of the capacitor 200 are formed of the same material layer. The silicide layers 425 and 455 of the transistor 400 and the silicide layer 225 of the capacitor 200 are formed of the same material layer.

In the embodiment, the semiconductor device further comprises an interlayer dielectric (ILD) layer 520 and contacts 540, 550, 560, 570, 580, and 590 therein. The interlayer dielectric layer 520 covers the capacitor 200, the resistor 300 and the transistor 400. In one embodiment, the interlayer dielectric layer 520 may comprise an oxide layer, a nitride layer, an oxynitride layer or other suitable insulating materials.

The contact 540 is on the metal electrode 260, and penetrates the interlayer dielectric layer 520 to be electrically connected to the metal electrode 260. The contact 550 is on the polysilicon electrode 230, and penetrates the interlayer dielectric layer 520 and the insulating layer 500 to electrically connect to the silicide layer 225. The contacts 560 and 570 are on the metal electrode 360, and penetrate the interlayer dielectric layer 520 to electrically connect to the metal electrode 360. The contacts 580 and 590 are on the source/drain regions 450, and penetrate the interlayer dielectric layer 520 and the insulating layer 500 to be electrically connected to the silicide layers 455 in the source/drain regions 450. In the embodiment, the contacts 540, 550, 560, 570, 580, and 590 are formed of the same material layer, and comprise metal or other suitable conducting materials.

Figure 2:
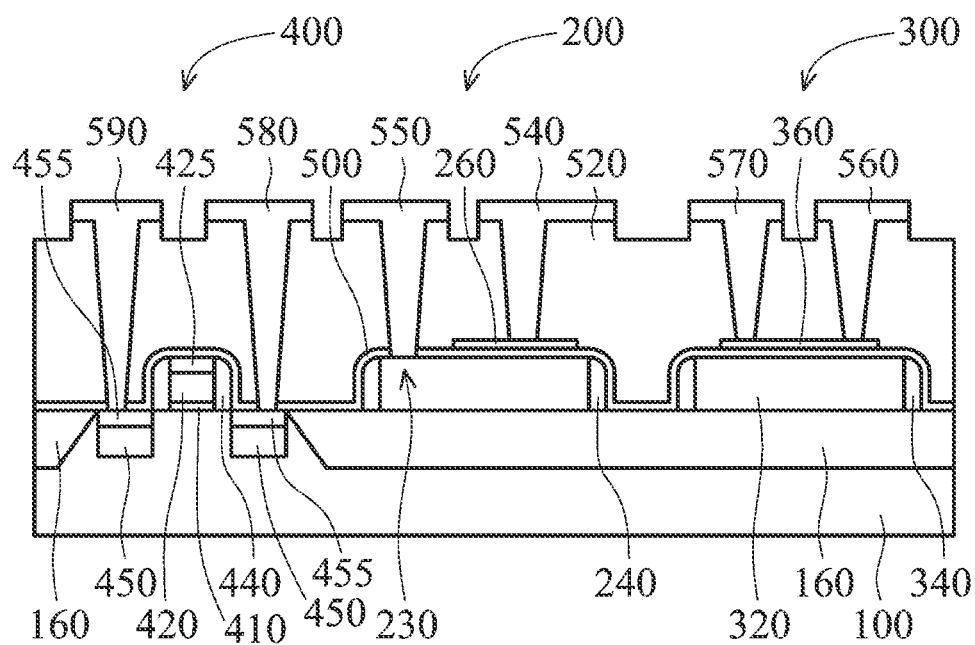
FIG. 2 is a cross-sectional view of another exemplary embodiment of a semiconductor device according to the invention.

Referring to FIG. 2, another exemplary embodiment of a semiconductor device according to the invention is illustrated, wherein elements in FIG. 2 that are the same as those in FIG. 1E are labeled with the same reference numbers as in FIG. 1E and are not described again. The semiconductor device structure shown in FIG. 2 is similar to that shown in FIG. 1E. The differences therebetween are that the polysilicon electrode 230 of the capacitor 200 shown in FIG. 2 does not comprise a silicide layer, and comprises dopants therein. Moreover, the barrier layer 350 between the polysilicon layer 320 and the metal electrode 360 shown in FIG. 1E, is omitted in FIG. 2, while the insulating layer 500 is retained between the polysilicon layer 320 and the metal electrode 360. It is realized that the capacitor 200 and the resistor 300 are disposed on the same isolation structure 160 in FIGS. 1E and 2, but in other embodiments, the capacitor 200 and the resistor 300 may be disposed on different isolation structures 160.

Compared to the semiconductor device having a polysilicon-insulator-polysilicon capacitor, the semiconductor device of the embodiments has a metal-insulator-polysilicon capacitor, and the metal material used therein costs less than the polysilicon material. Moreover, the metal electrode 260/360 has a thickness (such as in a range of 200 Å to 800 Å) smaller than that of a top electrode of polysilicon material (such as in a range of 1500 Å to 3000 Å). Accordingly, the size of the semiconductor device having the metal-insulator-polysilicon capacitor is decreased, and the integrated density thereof can be further improved, thereby facilitating the development of the advanced process. Moreover, since the electrode 260/360 is formed of the metal material, the doping process for the electrode 260/360 is not needed anymore. Accordingly, the process steps are simplified, and the manufacturing cost is reduced.

An exemplary embodiment of a method for forming a semiconductor device according to the invention is illustrated with FIGS. 1A to 1E, wherein FIGS. 1A to 1E are cross-sectional views of an exemplary embodiment of a method for forming a semiconductor device according to the invention.

Referring to FIG. 1A, a substrate 100 having isolation structures 160 configured to define active regions therein is provided. In the embodiment, the substrate 100 may be a single crystal silicon substrate, an epitaxial crystal silicon substrate, a silicon germanium substrate, a silicon-on-insulator (SOI) substrate, a compound semiconductor substrate or another suitable semiconductor substrate. In one embodiment, the isolation structure 160 may be a shallow trench isolation (STI) structure. In another embodiment, the isolation structure 160 may be a local oxidation of silicon (LOCOS) structure. When the isolation structure 160 is the STI structure, rather than the LOCOS structure, the isolation structure 160 can be formed by an etching process instead of an oxide process. Therefore, the size of the semiconductor device can be further decreased.

Referring to FIG. 1B, a gate dielectric layer 410 may be formed on the substrate 100 in the active regions defined by the isolation structures 160 by a deposition process, such as a chemical vapor deposition (CVD), a physical vapor deposition (PVD), an atomic layer deposition (ALD), a sputtering process, a coating process or another suitable deposition process. A polysilicon layer (not shown) is then formed on the substrate 100, and an etching process, such as a dry etching process, a wet etching process, a plasma etching process, a reactive ion etching (RIE) process or another suitable etching process, is performed on the polysilicon layer to form patterned polysilicon layers 220 and 320 on the isolation structure 160, and a patterned polysilicon layer 420 on the gate dielectric layer 410. Next, spacers 240, 340 and 440 are respectively formed on sidewalls of the polysilicon layers 220, 320 and 420 by a deposition process and an etching process.

Referring to FIG. 1C, source/drain regions 450 are formed in the substrate 100 within the active regions defined by the isolation structures 160, and respectively at the two opposite sides of the polysilicon layer 420 by a doping process, such as an implantation process. In the embodiment, the conductivity type of the source/drain regions 450 is n-type, but it is not limited thereto. In other embodiments, the conductivity type of the source/drain regions 450 is p-type and may be determined by design demands. For example, the doping process may be performed using p-type dopants, such as boron or boron fluoride, n-type dopants, such as phosphorous or arsenic, and/or a combination thereof.

Next, a barrier layer 350 is formed on the substrate 100 to cover the polysilicon layer 320 and the spacers 340, and expose the polysilicon layers 220 and 420 and the source/drain regions 450 by a deposition process. Next, a metal layer (not shown) is formed on the exposed polysilicon layers 220 and 420 and the exposed source/drain regions 450 by a deposition process. A thermal treatment, such as an annealing process, is performed on the metal layer to form silicide layers 225, 425 and 455 respectively on the surfaces of the polysilicon layers 220 and 420 and the source/drain regions 450. Next, the excess metal layer is removed, and the barrier layer 350 is retained. In another embodiment, the barrier layer 350 is removed (not shown) after the silicide layers 225, 425 and 455 are formed. In the embodiment, the silicide layers 225, 425 and 455 may comprise cobalt silicide, titanium silicide, tungsten silicide or other suitable materials.

In one embodiment, a polysilicon electrode 230 is composed of the polysilicon layer 220 and the silicide layer 225, as shown in FIG. 1C. In another embodiment, the barrier layer 350 may cover the polysilicon layers 220 and 320. Therefore, after the thermal treatment is performed on the metal layer, the silicide layers 425 and 455 are formed on the surfaces of the polysilicon layer 420 and the source/drain regions 450, but no silicide layer is formed on the surfaces of the polysilicon layers 220 and 320. Next, the barrier layer 350 is removed, and the polysilicon layer 220 is doped to be conductive, as shown in FIG. 2.

In the embodiment of FIG. 2, since the polysilicon electrode 230 is merely composed of the polysilicon material, the polysilicon electrode 230 needs to be doped. Compared to the embodiment of FIG. 2, the polysilicon electrode 230 in FIG. 1C is composed of the polysilicon layer 220 and the silicide layer 225 and therefore, the doping process does not need to be performed on the polysilicon electrode 230, thereby reducing the manufacturing cost.

Referring to FIG. 1D, an insulating layer 500 may be formed on the substrate 100 to cover the polysilicon electrode 230, the polysilicon layers 320 and 420, and the source/drain regions 450 by a deposition process. In one embodiment, the insulating layer 500 may comprise an oxynitride layer, an oxide layer, oxide-nitride-oxide stacked layers, high k dielectric material layers or other suitable insulating materials. Next, a metal layer (not shown) may be formed on the insulating layer 500 by a deposition process. An etching process is performed on the metal layer to form metal electrodes 260 and 360 respectively on the polysilicon electrode 230 and the polysilicon layer 320. In the embodiment, the metal electrodes 260 and 360 may comprise titanium nitride, tantalum nitride, a copper aluminum alloy or other suitable conducting materials. In one embodiment, the metal electrodes 260 and 360 may have a thickness in a range of 200 Å to 800 Å. In another embodiment, the metal electrodes 260 and 360 may have a thickness in a range of 400 Å to 600 Å.

In the embodiment, a capacitor 200 is formed by the polysilicon electrode 230, the insulating layer 500, and the metal electrode 260. The polysilicon electrode 230 is configured to be a bottom electrode of the capacitor 200. The insulating layer 500 is configured to be a capacitor dielectric layer of the capacitor 200. The metal electrode 260 is configured to be a top electrode of the capacitor 200. Moreover, a transistor 400 is formed by the metal electrode 360 serves as a resistor 300, and the polysilicon layer 420, the silicide layer 425 and the source drain regions 450.

Referring to FIG. 1E, an interlayer dielectric layer 520 may be formed on the substrate 100 and cover the capacitor 200, the resistor 300, and the transistor 400 by a deposition process. In the embodiment, the interlayer dielectric layer 520 may comprise oxide, nitride, oxynitride or other suitable insulating materials. Next, a plurality of openings (not shown) is formed in the interlayer dielectric layer 520 and the insulating layer 500 to expose portions of the polysilicon electrode 230, the metal electrodes 260 and 360, and the source/drain regions 450 by an etching process. Next, a metal layer (not shown) may be formed on the interlayer dielectric layer 520 and filled into the plurality of openings by a deposition process. Next, the metal layer may be patterned by an etching process, to form contacts 540, 550, 560, 570, 580, and 590 respectively configured to be interconnections of the capacitor 200, the resistor 300 and the transistor 400.

The contact 540 is on the metal electrode 260, and penetrates the interlayer dielectric layer 520 to be electrically connected to the metal electrode 260. The contact 550 is on the polysilicon electrode 230, and penetrates the interlayer dielectric layer 520 and the insulating layer 500 to be electrically connected to the silicide layer 225 in the polysilicon electrode 230. The contacts 560 and 570 are on the metal electrode 360, and penetrate the interlayer dielectric layer 520 to be electrically connected to the metal electrode 360. The contacts 580 and 590 are on the source/drain regions 450, and penetrate the interlayer dielectric layer 520 and the insulating layer 500 to be electrically connected to the silicide layers 455 in the source/drain regions 450. In the embodiment, the contacts 540, 550, 560, 570, 580, and 590 comprise metal or other suitable conducting materials.

According to the embodiments, the capacitor has a metal-insulator-polysilicon structure. The metal electrode 260/360 has a thickness (such as in a range of 200 Å to 800 Å) smaller than that of a top electrode of polysilicon material (such as in a range of 1500 Å to 3000 Å), such that the thickness of the subsequently formed interlayer dielectric layer 520 can be reduced. As a result, the aspect ratio (AR) of openings for forming the contacts 540, 550, 560, 570, 580, and 590 of the capacitor 200, the resistor 300, and the transistor 400 is reduced. Accordingly, the size of the semiconductor device is decreased, and quality and performance of the semiconductor device can be further improved.

When a top electrode of a capacitor is formed of a polysilicon material, the polysilicon top electrode needs to be doped, and a densification process is performed on an insulating layer under the polysilicon top electrode. As a result, the capacitor having the polysilicon top electrode has high manufacturing cost and has high thermal budget. In contrast, according to the embodiments, since the top electrode is formed of a metal material, the doping and densification processes do not need to be performed anymore. Accordingly, the process steps are simplified, and the manufacturing cost and the thermal budget are reduced. In addition, features of the source/drain regions can be prevented from affecting by the high temperature processes.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having an isolation structure therein;
   a capacitor disposed on the isolation structure and comprising:
      a polysilicon electrode;
      an insulating layer disposed on the polysilicon electrode; and
      a metal electrode disposed on the insulating layer;
   a polysilicon layer disposed on the isolation structure; and a resistor disposed on the polysilicon layer and comprising an another metal electrode, wherein the insulating layer extends between the another metal electrode and the polysilicon layer, and a top surface of the polysilicon electrode is below a bottom surface of the another metal electrode over the insulating layer.

2. The semiconductor device as claimed in claim 1, wherein the polysilicon electrode comprises a silicide layer adjacent to the top surface of the polysilicon electrode.

3. The semiconductor device as claimed in claim 2, wherein the silicide layer comprises cobalt silicide, titanium silicide or tungsten silicide.

4. The semiconductor device as claimed in claim 1, wherein the metal electrode comprises titanium nitride, tantalum nitride or a copper aluminum alloy.

5. The semiconductor device as claimed in claim 1, wherein the metal electrode has a thickness in a range of 200 Å to 800 Å.

6. The semiconductor device as claimed in claim 1, wherein the insulating layer comprises an oxynitride layer, an oxide layer, oxide-nitride-oxide stacked layers or high k dielectric material layers.

7. The semiconductor device as claimed in claim 1, wherein the isolation structure is a shallow trench isolation structure.

8. The semiconductor device as claimed in claim 1, further comprising:
a first contact disposed on and electrically connected to the metal electrode; and
a second contact disposed on the polysilicon electrode and penetrating the insulating layer to be electrically connected to the polysilicon electrode.

9. The semiconductor device as claimed in claim 1, wherein the bottom surface of the another metal electrode over the insulating layer is above a bottom surface of the metal electrode.

10. A method for forming a semiconductor device, comprising:
providing a substrate having an isolation structure therein;
forming a polysilicon electrode and a polysilicon layer on the isolation structure;
forming an insulating layer on the polysilicon electrode and the polysilicon layer; and
forming a metal electrode and an another metal electrode on the insulating layer, wherein a capacitor is composed of the polysilicon electrode, the insulating layer and the metal electrode over the polysilicon electrode, and a resistor comprises the another metal electrode over the polysilicon layer, and wherein a top surface of the polysilicon electrode is below a bottom surface of the another metal electrode over the insulating layer.

11. The method as claimed in claim 10, wherein the step of forming the polysilicon electrode comprises forming a silicide layer adjacent to a top surface of the polysilicon electrode.

12. The method as claimed in claim 11, wherein the silicide layer comprises cobalt silicide, titanium silicide or tungsten silicide.

13. The method as claimed in claim 10, wherein the metal electrode comprises titanium nitride, tantalum nitride or a copper aluminum alloy.

14. The method as claimed in claim 10, wherein the metal electrode has a thickness in a range of 200 Å to 800 Å.

15. The method as claimed in claim 10, wherein the insulating layer comprises an oxynitride layer, an oxide layer, oxide-nitride-oxide stacked layers or high k dielectric material layers.

16. The method as claimed in claim 10, wherein the isolation structure is a shallow trench isolation structure.

17. The method as claimed in claim 10, further comprising:
forming a first contact on the metal electrode to be electrically connected thereto; and
forming a second contact on the polysilicon electrode to be electrically connected thereto, wherein the second contact penetrates the insulating layer.

18. The method as claimed in claim 10, wherein the bottom surface of the another metal electrode over the insulating layer is above a bottom surface of the metal electrode.

19. The semiconductor device as claimed in claim 8, wherein the metal electrode is sandwiched between the insulating layer and the first contact.

* * * * *